United States Patent
Yu et al.

(10) Patent No.: US 9,754,982 B2
(45) Date of Patent: Sep. 5, 2017

(54) PACKAGING MODULE AND SUBSTRATE STRUCTURE THEREOF

(71) Applicant: PHOENIX PIONEER TECHNOLOGY CO., LTD., Hsinchu County (TW)

(72) Inventors: Chun-Hsien Yu, Hsinchu County (TW); Chu-Chin Hu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 8 days.

(21) Appl. No.: 15/062,336

(22) Filed: Mar. 7, 2016

(65) Prior Publication Data

US 2016/0268326 A1    Sep. 15, 2016

(30) Foreign Application Priority Data

Mar. 12, 2015    (CN) .......................... 2015 1 0109130

(51) Int. Cl.
  *H01L 27/146*    (2006.01)
(52) U.S. Cl.
  CPC .. *H01L 27/14618* (2013.01); *H01L 27/14636* (2013.01)

(58) Field of Classification Search
  CPC ......... H01L 27/14618; H01L 27/14636; H01L 23/043
  See application file for complete search history.

(56) References Cited

U.S. PATENT DOCUMENTS

2016/0212852 A1*    7/2016    Hu ....................... H01L 23/5389

* cited by examiner

*Primary Examiner* — Mark Prenty
(74) *Attorney, Agent, or Firm* — Amin, Turocy & Watson LLP (57) ABSTRACT

A substrate structure is provided, including a first insulating layer, a first circuit layer embedded in and bonded to the first insulating layer; a plurality of first conductive posts formed in the first insulating layer and electrically connected to the first circuit layer, a second circuit layer formed on the first insulating layer and electrically connected to the first circuit layer through the first conductive posts, a plurality of second conductive posts and a plurality of conductive bumps formed on the second circuit layer, and a second insulating layer formed on the first insulating layer and encapsulating the second circuit layer, the second conductive posts and the conductive bumps. The second insulating layer has a cavity exposing the conductive bumps. When the substrate structure is applied to a camera lens, a sensor element can be disposed in the cavity to reduce the thickness of the overall packaging module.

20 Claims, 9 Drawing Sheets

PACKAGING MODULE AND SUBSTRATE STRUCTURE THEREOF

BACKGROUND

1. Technical Field

The present disclosure relates to substrate structures, and more particularly, to a substrate structure allowing an electronic element to be embedded therein.

2. Description of Related Art

Along with the rapid development of electronic industries, electronic products are developed toward the trend of miniaturization and multi-function. Accordingly, various types of packages have been developed. Generally, electronic elements of sensor elements and camera lenses are packaged to form wire-bonding or COB (Chip on Board) type structures.

Figure 1:
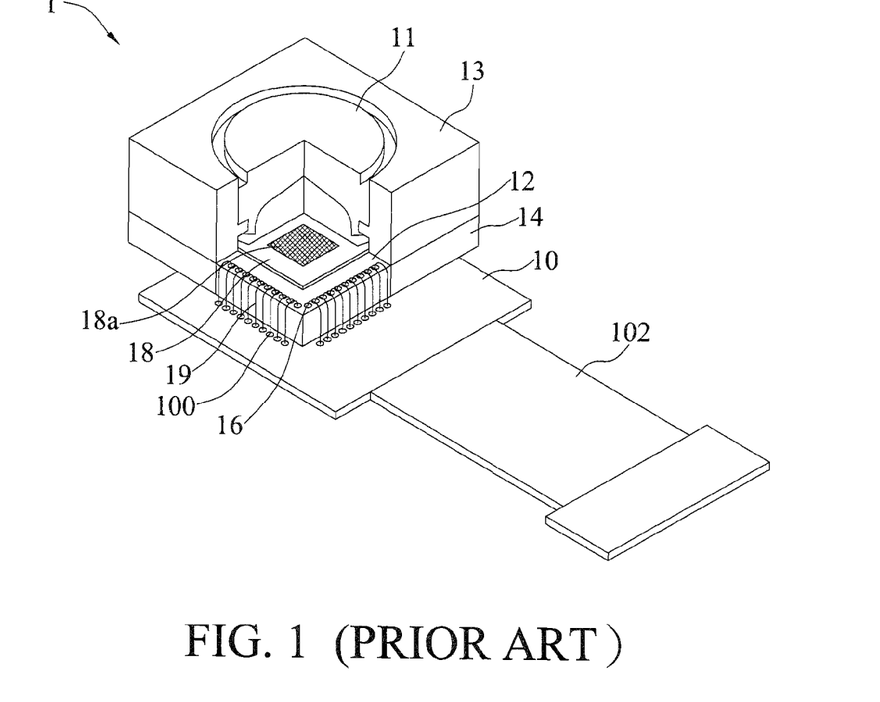
FIG. 1 is a schematic partially cut-away perspective view of a conventional packaging module.

FIG. 1 is a schematic partially cut-away perspective view of a conventional camera module. Referring to FIG. 1, the camera module is a wire-bonding type packaging module. The packaging module 1 has a circuit element 10, a holder 14 disposed on the circuit element 10, a packaging body 12 held by the holder 14, an IC electronic element 18 packaged by the packaging body 12, a driving element 13 disposed on the holder 14, and a lens 11 disposed on the driving element 13.

The circuit element 10 is a rigid-flex circuit board having a plurality of electrical contacts 100 and a cable 102 for external connection. The holder 14 is disposed on the circuit element 10 for holding the packaging body 12. The packaging body 12 is used to package the electronic element 18. The packaging body 12 has a plurality of circuit layers (not shown) electrically connected to the electronic element 18. Further, the circuit layers have a plurality of conductive pads 16 that are electrically connected to the electrical contacts 100 of the circuit element 10 through a plurality of bonding wires 19 such as gold wires. The electronic element 18 has a sensing area 18a on an upper surface thereof, and the sensing area 18a is exposed from the packaging body 12 for light sensing. The driving element 13 is a voice coil motor (VCM) disposed on the holder 14. The lens 11 is disposed on the driving element 13 and covers the sensing area 18a of the electronic element 18.

FIG. 1' is a schematic cross-sectional view of another conventional camera module. Referring to FIG. 1', the camera module is a wire-bonding type packaging module 1'. The packaging module 1' has a packaging substrate 10', a holder 14 and an IC electronic element 18 disposed on the packaging substrate 10', a transparent element 12' and a driving element 13 disposed on the holder 14, and a lens 11 disposed on the driving element 13.

The electronic element 18 is electrically connected to the packaging substrate 10' through a plurality of bonding wires 19 such as gold wires. The holder 14 is disposed on the packaging substrate 10' through an adhesive 140 and covers the electronic element 18. Further, the holder 14 has a cavity 141. The electronic element 18 has a sensing area 18a on an upper surface thereof, and the sensing area 18a is exposed from the cavity 141 of the holder 14 for light sensing. The transparent element 12' is made of, for example, glass. The transparent element 12' is attached to a bottom of the cavity 141 of the holder 14 and covers the sensing area 18a of the electronic element 18. The driving element 13 is a VCM disposed on a wall surface of the cavity 141 of the holder 14. The lens 11 is disposed on the driving element 13 and covers the transparent element 12'.

The packaging modules 1, 1' have high cost and assembly difficulty due to a large number of components.

Further, a large number of component layers of the packaging modules 1, 1' make it difficult to reduce the thickness and size of the packaging modules 1, 1'. For example, since the driving element 13 of the packaging module 1 has a great thickness and is bonded to the packaging body 12 through the holder 14, it is difficult to reduce the thickness of the packaging module 1. Furthermore, connecting points (for example, the conductive pads 16) are generally arranged around peripheries of the packaging body 12 and the driving element 13. As such, it is difficult to reduce the size of the packaging module 1. Also, since the holder 14 of the packaging module 1' is required to have a volume enough to cover the electronic element 18, the size of the packaging module 1' is difficult to be reduced.

In addition, the bonding wires 19 of the packaging modules 1, 1' have a certain wire loop, and the holder 14 is required to have a sufficient height to prevent the driving element 13 (or the transparent element 12') from coming into contact with the bonding wires 19. As such, thinning of the packaging modules 1, 1' cannot be achieved.

Furthermore, the adhesive 140 between the holder 14 and the packaging substrate 10' of the packaging module 1' easily causes an alignment problem and increases the thickness of the packaging module 1'.

Therefore, how to overcome the above-described drawbacks has become critical.

SUMMARY

In view of the above-described drawbacks, the present disclosure provides a substrate structure, which comprises: a first insulating layer having opposite first and second surfaces; a first circuit layer embedded in and bonded to the first surface of the first insulating layer; a plurality of first conductive posts formed in the first insulating layer and electrically connected to the first circuit layer; a second circuit layer formed on the second surface of the first insulating layer and electrically connected to the first circuit layer through the first conductive posts; a plurality of second conductive posts and a plurality of conductive bumps formed on the second circuit layer; and a second insulating layer formed on the second surface of the first insulating layer and encapsulating the second circuit layer, the second conductive posts and the conductive bumps, wherein the second insulating layer has at least a cavity exposing the conductive bumps.

In an embodiment, surfaces of the conductive bumps are lower than or higher than a bottom surface of the cavity. In another embodiment, surfaces of the conductive bumps are flush with a bottom surface of the cavity.

In an embodiment, the above-described substrate structure further comprises a third circuit layer formed on the second insulating layer and electrically connected to the second circuit layer through the second conductive posts. The substrate structure can further comprise a plurality of conductive pads formed on the third circuit layer. Also, the substrate structure can further comprise a third insulating layer formed on the second insulating layer and the third circuit layer. Alternatively, the substrate structure can further comprise a plurality of third conductive posts formed on the third circuit layer, and a third insulating layer formed on the second insulating layer and encapsulating the third circuit layer and the third conductive posts. Further, the substrate structure can comprise a fourth circuit layer formed on the third insulating layer and electrically connected to the third circuit layer through the third conductive posts.

In an embodiment, the above-described substrate structure further comprises a circuit element disposed on the first surface or the second surface of the first insulating layer.

In an embodiment, the above-described substrate structure further comprises a plurality of conductive elements formed on the first surface of the first insulating layer or on the second insulating layer.

By applying the above-described substrate structure to a camera lens, the present disclosure further provides a packaging module, which comprises: the above-described substrate structure; and at least an electronic element disposed in the cavity and electrically connected to the conductive bumps, wherein the electronic element has a sensing area exposed from the cavity. As such, the present disclosure reduces the thickness of the overall packaging module.

Further, since a packaging body (or a packaging substrate) and a holder (even a circuit element and a driving element) are integrally fabricated as the substrate structure, the present disclosure effectively reduces the thickness of the overall structure of the cameral lens and simplifies the components, thereby greatly reducing the fabrication cost and facilitating the assembly process.

The above-described packaging module can further comprise a transparent element or lens covering the sensing area of the electronic element.

The above-described packaging module can further comprise a driving element disposed on the second insulating layer.

BRIEF DESCRIPTION OF DRAWINGS

FIG. 1' is a schematic cross-sectional view of another conventional packaging module;

FIG. 4' is a schematic cross-sectional view of a substrate structure according to a fourth embodiment of the present disclosure.

DETAILED DESCRIPTION

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2G are schematic cross-sectional views showing a method for fabricating a substrate structure 2 according to a first embodiment of the present disclosure.

Figure 2A:
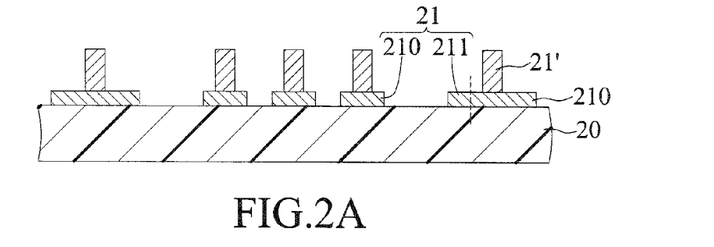
FIGS. 2A to 2G are schematic cross-sectional views showing a method for fabricating a substrate structure according to a first embodiment of the present disclosure, wherein FIG. 2G' is an upper view of a circuit element.

Referring to FIG. 2A, a first circuit layer 21 is formed on a carrier 20 through a patterning process. Then, a plurality of first conductive posts 21' are formed on the first circuit layer 21.

In the present embodiment, the carrier 20 is a substrate, for example, a copper coil substrate.

The first circuit layer 21 has a plurality of conductive pads 210 and conductive traces 211. The first conductive posts 21' are copper posts.

Figure 2B:
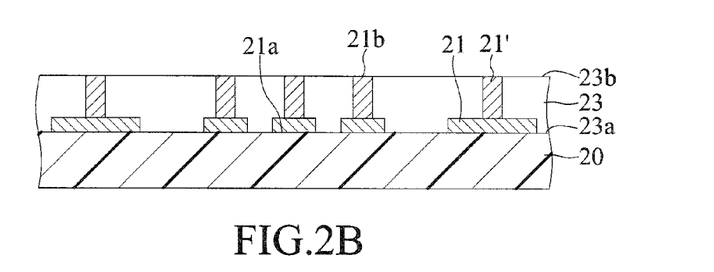

Referring to FIG. 2B, a first insulating layer 23 is formed on the carrier 20 to encapsulate the first circuit layer 21 and the first conductive posts 21'. The first insulating layer 23 has a first surface 23a bonded to the carrier 20 and a second surface 23b opposite to the first surface 23a.

In the present embodiment, one end surfaces 21b of the first conductive posts 21' are exposed from the second surface 23b of the first insulating layer 23.

Further, a surface 21a of the first circuit layer 21 is flush with the first surface 23a of the first insulating layer 23.

The first insulating layer 23 is formed by laminating or molding and made of a molding compound, or a dielectric material such as an epoxy resin, polyimide or other photosensitive or non-photosensitive organic resin.

Figure 2C:
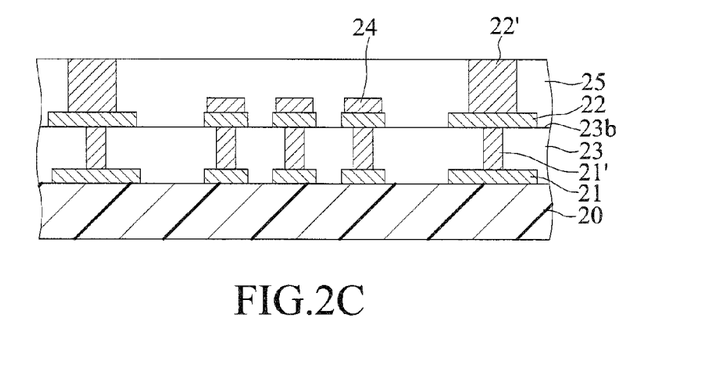

Referring to FIG. 2C, a second circuit layer 22 is formed on the second surface 23b of the first insulating layer 23 and electrically connected to the first circuit layer 21 through the first conductive posts 21'. Then, a plurality of second conductive posts 22' and a plurality of conductive bumps 24 are formed on the second circuit layer 22. Thereafter, a second insulating layer 25 is formed on the second surface 23b of the first insulating layer 23 to encapsulate the second circuit layer 22, the second conductive posts 22' and the conductive bumps 24.

In the present embodiment, the second circuit layer 22 is in direct connection with the first conductive posts 21' and the conductive bumps 24, The second conductive posts 22' are copper posts and have one end surfaces exposed from the second insulating layer 25.

The conductive bumps 24 are not exposed from the second insulating layer 25.

Further, the second insulating layer 25 is formed by laminating or molding and made of a molding compound, or a dielectric material such as an epoxy resin, polyimide or other photosensitive or non-photosensitive organic resin.

Figure 2D:
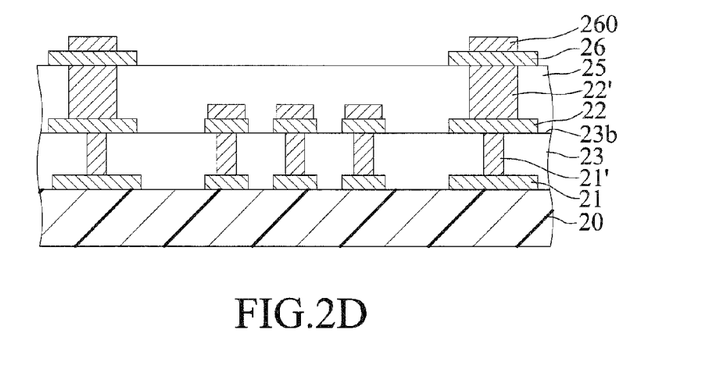

Referring to FIG. 2D, a third circuit layer 26 is formed on the second insulating layer 25 and electrically connected to the second circuit layer 22 through the second conductive posts 22'. Then, a plurality of conductive pads 260 are formed on the third circuit layer 26.

Figure 2E:
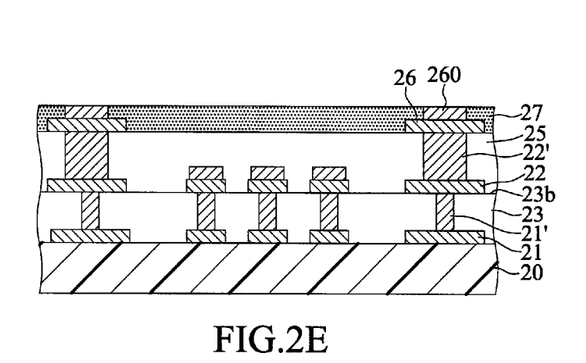

Referring to FIG. 2E, an insulating layer 27 is formed on the second insulating layer 25 and the third circuit layer 26, and the conductive pads 260 are exposed from the insulating layer 27.

In the present embodiment, the insulating layer 27 is made of a solder mask, a dielectric material or a molding compound.

A surface of the insulating layer 27 can be flush with top surfaces of the conductive pads 260 so as to expose the top surfaces of the conductive pads 260 from the insulating layer 27. Alternatively, the insulating layer 27 can have a plurality of openings exposing the conductive pads 260.

Figure 2F:
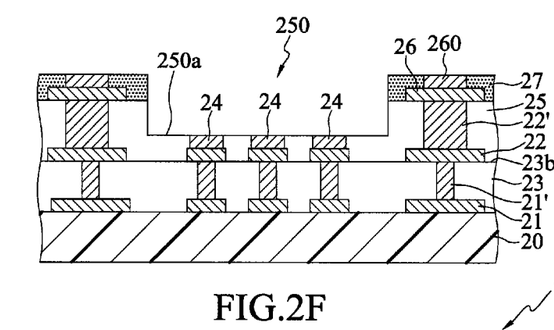

Referring to FIG. 2F, at least a cavity 250 is formed to penetrate the insulating layer 27 and extend into the second insulating layer 25 so as to expose the conductive bumps 24.

In the present embodiment, the cavity 250 is formed by a physical or chemical method, for example, by physical grinding, laser ablation or chemical etching. The present embodiment dispenses with a conventional miller cutting method so as to reduce chamfer angles at corners of the cavity 250 (for example, at a bottom side or a top open side of the cavity 250).

Further, surfaces of the conductive bumps 24 are flush with, slightly higher or lower than a bottom surface 250a of the cavity 250.

Figure 2G:
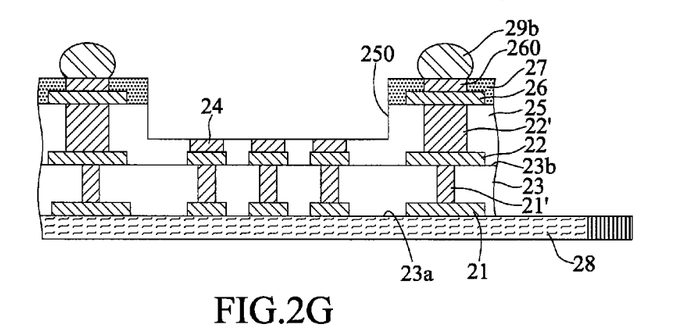

Referring to FIG. 2Q the carrier 20 is removed and the first circuit layer 21 remains embedded in the first surface 23a of the first insulating layer 23. Then, a circuit element 28 is disposed on the first surface 23a of the first insulating layer 23.

In the present embodiment, referring to FIG. 2G', the circuit element 28 is a rigid-flex circuit board having a plurality of electrical contacts 280, a plurality of functional contacts 281 (used for, for example, power supply, heat dissipation or grounding) and a cable 282. The electrical contacts 280 and the functional contacts 281 are electrically connected to the first circuit layer 21.

Further, a plurality of conductive elements 29b are formed on the second insulating layer 25 and electrically connected to the conductive pads 260. As such, an electronic device (not shown) can be stacked on and bonded to the conductive elements 29b. The conductive elements 29b are, for example, solder balls, solder bumps or copper bumps.

Figure 3A:
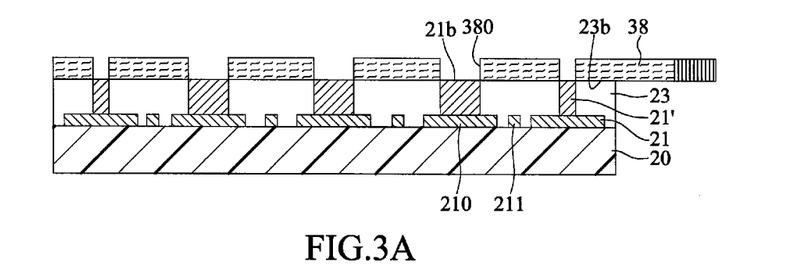
FIGS. 3A to 3C are schematic cross-sectional views showing a method for fabricating a substrate structure according to a second embodiment of the present disclosure.
Figure 3B:
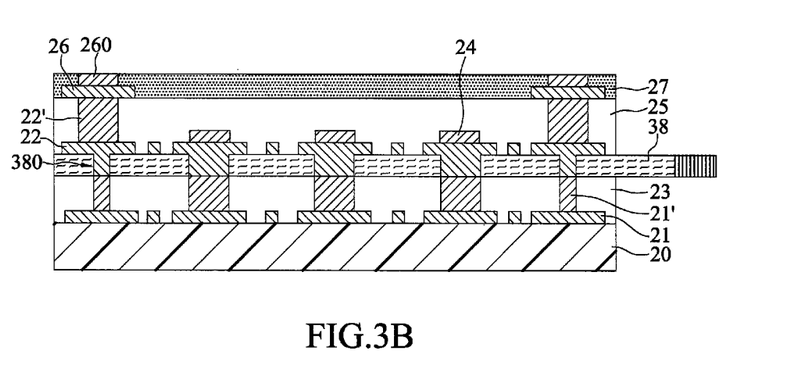
Figure 3C:
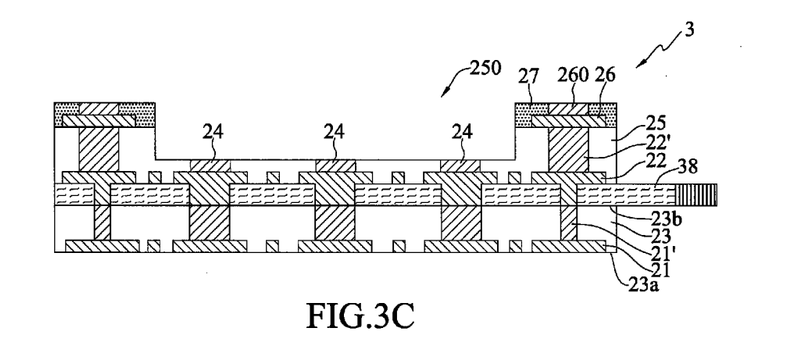

FIGS. 3A to 3C are schematic cross-sectional views showing a method for fabricating a substrate structure 3 according to a second embodiment of the present disclosure. The second embodiment differs from the first embodiment in the process of the circuit element.

Referring to FIG. 3A, continued from FIG. 2B, a circuit element 38 is disposed on the second surface 23b of the first insulating layer 23, and a plurality of openings 380 are formed in the circuit element 38 to expose the end surfaces 21b of the first conductive posts 21'.

Referring to FIG. 3B, the processes of FIGS. 2C to 2E are performed. Therein, the second circuit layer 22 extends into the openings 380 of the circuit element 38 and is electrically connected to the first conductive posts 21'.

Referring to FIG. 3C, the process of FIG. 2F is performed. At least a cavity 250 is formed to penetrate the insulating layer 27 and extend into the second insulating layer 25 so as to expose the conductive bumps 24. Thereafter, the carrier 20 is removed and the first circuit layer 21 is exposed from the first surface 23a of the first insulating layer 23.

Figure 4:
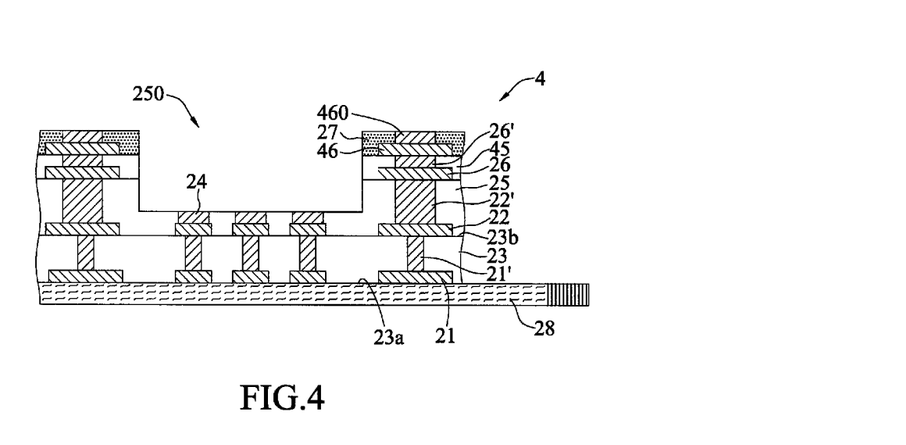
FIG. 4 is a schematic cross-sectional view of a substrate structure according to a third embodiment of the present disclosure.

FIG. 4 is a schematic cross-sectional view of a substrate structure 4 according to a third embodiment of the present disclosure. The third embodiment differs from the first embodiment in the formation of a redistribution layer.

Referring to FIG. 4, continued from the process of FIG. 2D, a plurality of third conductive posts 26' are formed on the third circuit layer 26, and a third insulating layer 45 is formed on the second insulating layer 25 to encapsulate the third circuit layer 26 and the third conductive posts 26'.

Then, a fourth circuit layer 46 is formed on the third insulating layer 45 and electrically connected to the third circuit layer 26 through the third conductive posts 26'. Thereafter, a plurality of conductive pads 460 are formed on the fourth circuit layer 46.

Subsequently, an insulating layer 27 is formed on the third insulating layer 45 and the fourth circuit layer 46, and the conductive pads 460 are exposed from the insulating layer 27.

Then, at least a cavity 250 is formed to penetrate the insulating layer 27 and extend into the second insulating layer 25 so as to expose the conductive bumps 24. Finally, the carrier 20 is removed for disposing the circuit element 28.

Therefore, the present disclosure can increase the number of the circuit layers and the depth of the cavity 250 according to the practical need.

In the first and third embodiments, a plurality of solder balls can further be mounted on a lower side of the circuit element 28.

FIG. 4' is a schematic cross-sectional view of a substrate structure 4' according to a fourth embodiment of the present disclosure. Different from the first to third embodiments, the fourth embodiment dispenses with the circuit element.

Referring to FIG. 4', the first insulating layer 23 is not bonded with a circuit element. The first circuit layer 21 is exposed from the first surface 23a of the first insulating layer 23 and a plurality of conductive elements 29a are formed on and electrically connected to the first circuit layer 21. An electronic device (not shown) can further be stacked on and bonded to the conductive elements 29a.

In the present embodiment, the conductive elements 29a are, for example, solder balls, solder bumps or copper bumps.

The substrate structure 2, 3, 4, 4' of the present disclosure is fabricated through copper connection in molding (C2iM) technologies. If the substrate structure 2, 3, 4, 4' is applied in fingerprint identification or image sensor products, a circuit element, a packaging body (or a packaging substrate) and a holder can be integrally fabricated as the substrate structure 2, 3, 4, 4'. Further, according to the practical need, a voice coil motor (for example, the substrate structure 4 of FIG. 4) can be integrally fabricated at the same time. As such, a thin structure is achieved and the components are greatly simplified. In particular, the substrate structure 2, 3, 4, 4' only needs to be assembled with a sensor element, thus greatly reducing the fabrication cost and simplifying the assembly process.

Further, the cavity 250 allows the sensor element to be embedded in the insulating layer so as to reduce the thickness of the overall packaging module.

Furthermore, since the circuit element, the packaging body (or the packaging substrate) and the holder are fabricated integrally, the present disclosure dispenses with the conventional adhesive and hence overcomes the conventional alignment problem and reduces the thickness of the packaging module.

FIGS. 5A to 5D' show application of the substrate structures 2, 3, 4, 4'.

Figure 5A:
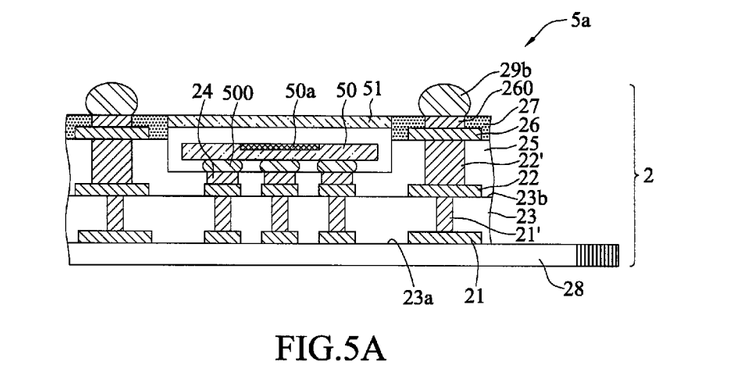
FIGS. 5A to 5D' are schematic cross-sectional views of packaging modules having substrate structures of the present disclosure.

FIGS. 5A and 5A' are schematic cross-sectional views showing application of the substrate structure 2 in a packaging module 5a of a camera lens.

Referring to FIG. 5A, at least an electronic element 50 is disposed in the cavity 250 and electrically connected to the conductive bumps 24. Then, a transparent element 51 is disposed on the cavity 250. The transparent element 51 covers a sensing area 50a of the electronic element 50 without coming into contact with the electronic element 50.

In the present embodiment, the electronic element 50 is a sensor element. For example, the electronic element 50 is a semiconductor chip structure having a sensing area 50a formed on an upper side thereof for light sensing or fingerprint identification. The sensing area 50a is exposed from the cavity 250.

Further, the electronic element 50 is packaged in a flip-chip manner. In particular, the electronic element 50 has a plurality of electrode pads (not shown) formed on a lower side thereof and electrically connected to the conductive bumps 24 through a conductive material 500. The conductive material 500 is for example, a solder material, bumps or a conductive adhesive, and formed by printing or dispensing.

The transparent element 51 is a filter or glass element. For example, the transparent element 51 is an infrared glass element that covers the sensing area 50a of the electronic element 50.

In another embodiment, referring to FIG. 5A', the electronic element 50' is packaged by wire bonding. In particular, the electronic element 50' has a plurality of electrode pads (not shown) formed on an upper side thereof and electrically connected to the conductive bumps 24 through a plurality of bonding wires 500', and a lower side of the electronic element 50' is disposed on the bottom surface of the cavity 250 through an adhesive 501. As such, the conductive bumps 24 on the second circuit layer 22 under the electronic element 50 can be dispensed with.

Figure 5B:
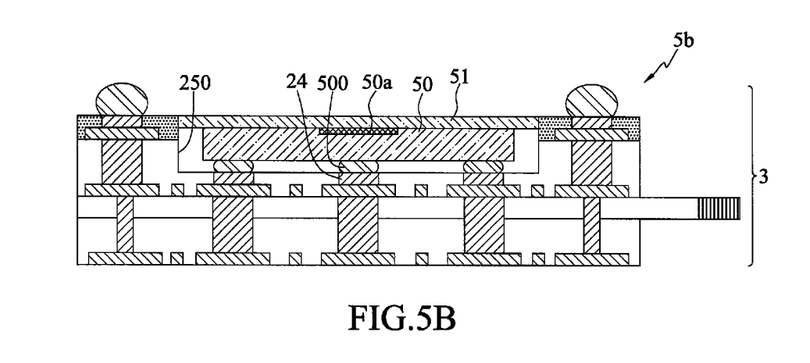

FIGS. 5B and 5B' are schematic cross-sectional views showing application of the substrate structure 3 in a packaging module 5b of a camera lens. Referring to FIG. 5B, the transparent element 51 is in contact with the electronic element 50.

Figure 5C:
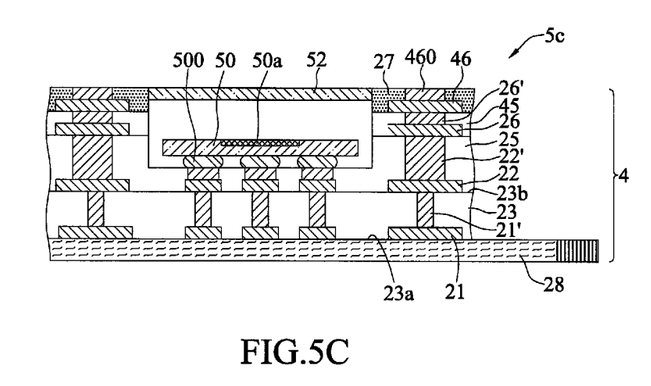

FIGS. 5C and 5C' are schematic cross-sectional views showing application of the substrate structures 2, 4 in a packaging module 5c of a camera lens. Therein, a lens 52 is provided.

Referring to FIG. 5C, the lens 52 is disposed at an open side of the cavity 250 of the substrate structure 4 of FIG. 4. In particular, the lens 52 is disposed on the insulating layer 27 to cover the sensing area 50a of the electronic element 50.

Referring to FIG. 5C', a driving element 53 is disposed on the conductive elements 29b of the substrate structure 2 of FIG. 2G, and the lens 52 is disposed on the driving element 53 to cover the sensing area 50a of the electronic element 50.

Figure 5D:
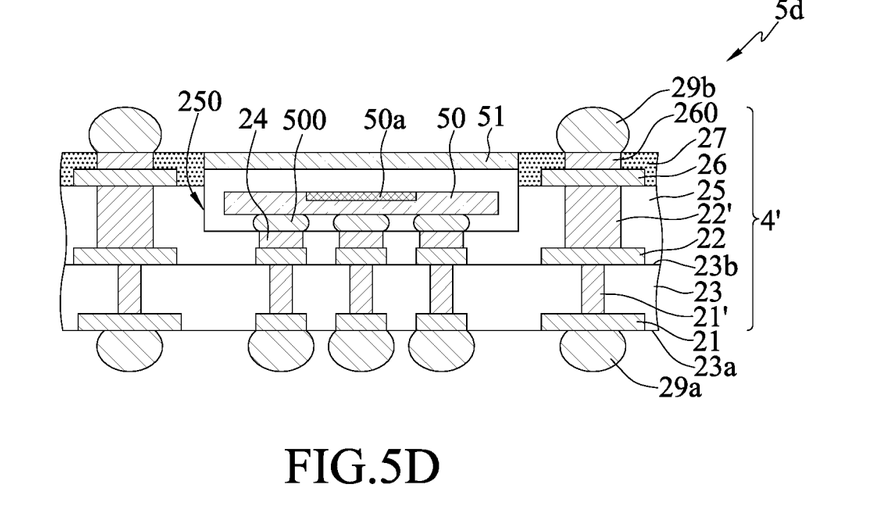

FIGS. 5D and 5D' are schematic cross-sectional views showing application of the substrate structure 4' in a packaging module 5d of a camera lens. Therein, a circuit board (not shown) can be bonded to the conductive elements 29a on the first circuit layer 21.

According to the practical need, an insulating material (not shown) can be filled in the cavity 250 to encapsulate the electronic element 50.

Therefore, since the packaging body and the holder (even the driving element) of a camera lens are integrally fabricated as the substrate structure 2, 3, 4, 4', the present disclosure reduces the number of the components and hence reduces the fabrication cost and simplifies the assembly process.

Further, by integrally fabricating the packaging body and the holder (even the driving element) of the camera lens, the thickness of each layer can be controlled to reduce the thickness and size of the overall packaging module. For example, in the substrate structure 2, 3, 4, 4', the connecting points (for example, the conductive pads 210) can be arranged according to the practical need so as to reduce the size of the packaging module of the camera lens. Further, since the holder of the substrate structure 2, 3, 4, 4' does not need to cover the electronic element 50, the size of the packaging modules 5A to 5D can be reduced.

Furthermore, since the circuit element 28 is directly attached to the first insulating layer 23 and the electronic element 50 is disposed in the cavity 250 of the substrate structure 2, 3, 4, 4', the wire loop of the bonding wires will not adversely affect the size of the packaging module as in the prior art. Further, if the electronic element 50 is packaged in a flip-chip manner, no wire loop is generated. As such, the thickness of the overall packaging module can be reduced and thinning of the camera lens can be achieved.

In addition, the camera lens is applicable in a BGA (Ball Grid Array) or LGA (Land Grid Array) package.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A substrate structure, comprising:
   a first insulating layer having opposite first and second surfaces;
   a first circuit layer embedded in and bonded to the first surface of the first insulating layer;
   a plurality of first conductive posts formed in the first insulating layer and electrically connected to the first circuit layer;
   a second circuit layer formed on the second surface of the first insulating layer and electrically connected to the first circuit layer through the first conductive posts;
   a plurality of second conductive posts and a plurality of conductive bumps formed on the second circuit layer; and
   a second insulating layer formed on the second surface of the first insulating layer and encapsulating the second circuit layer, the second conductive posts and the conductive bumps, wherein the second insulating layer has at least a cavity exposing the conductive bumps.

2. The substrate structure of claim 1, wherein surfaces of the conductive bumps are lower than or higher than a bottom surface of the cavity.

3. The substrate structure of claim 1, wherein surfaces of the conductive bumps are flush with a bottom surface of the cavity.

4. The substrate structure of claim 1, further comprising a third circuit layer formed on the second insulating layer and electrically connected to the second circuit layer through the second conductive posts.

5. The substrate structure of claim 4, further comprising a plurality of conductive pads formed on the third circuit layer.

6. The substrate structure of claim 4, further comprising a third insulating layer formed on the second insulating layer and the third circuit layer.

7. The substrate structure of claim 4, further comprising a plurality of third conductive posts formed on the third circuit layer, and a third insulating layer formed on the second insulating layer and encapsulating the third circuit layer and the third conductive posts.

8. The substrate structure of claim 7, further comprising a fourth circuit layer formed on the third insulating layer and electrically connected to the third circuit layer through the third conductive posts.

9. The substrate structure of claim 1, further comprising a circuit element disposed on the first surface or the second surface of the first insulating layer.

10. The substrate structure of claim 1, further comprising a plurality of conductive elements formed on the first surface of the first insulating layer or on the second insulating layer.

11. A packaging module, comprising:
the substrate structure of claim 1; and
at least an electronic element disposed in the cavity and electrically connected to the conductive bumps, wherein the electronic element has a sensing area exposed from the cavity.

12. The packaging module of claim 11, further comprising a third circuit layer formed on the second insulating layer and electrically connected to the second circuit layer through the second conductive posts.

13. The packaging module of claim 12, further comprising a plurality of conductive pads formed on the third circuit layer.

14. The packaging module of claim 12, further comprising a third insulating layer formed on the second insulating layer and the third circuit layer.

15. The packaging module of claim 12, further comprising a plurality of third conductive posts formed on the third circuit layer, and a third insulating layer formed on the second insulating layer and encapsulating the third circuit layer and the third conductive posts.

16. The packaging module of claim 15, further comprising a fourth circuit layer formed on the third insulating layer and electrically connected to the third circuit layer through the third conductive posts.

17. The packaging module of claim 11, further comprising a circuit element disposed on the first surface or the second surface of the first insulating layer.

18. The packaging module of claim 11, further comprising a plurality of conductive elements formed on the first surface of the first insulating layer or on the second insulating layer.

19. The packaging module of claim 11, further comprising a transparent element or lens covering the sensing area of the electronic element.

20. The packaging module of claim 11, further comprising a driving element disposed on the second insulating layer.

* * * * *